(12) United States Patent
Nawata

(10) Patent No.: US 9,671,704 B2
(45) Date of Patent: Jun. 6, 2017

(54) VIBRATION REDUCTION APPARATUS, LITHOGRAPHY APPARATUS AND METHOD OF MANUFACTURING ARTICLE

(71) Applicant: CANON KABUSHIKI KAISHA, Tokyo (JP)

(72) Inventor: Ryo Nawata, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 147 days.

(21) Appl. No.: 14/546,022

(22) Filed: Nov. 18, 2014

(65) Prior Publication Data

US 2015/0153659 A1    Jun. 4, 2015

(30) Foreign Application Priority Data

Nov. 29, 2013  (JP) ................................. 2013-248342

(51) Int. Cl.
  *G03B 27/58*  (2006.01)
  *G03F 7/20*  (2006.01)
  *G03F 7/00*  (2006.01)

(52) U.S. Cl.
  CPC ............ *G03F 7/709* (2013.01); *G03F 7/0002* (2013.01)

(58) Field of Classification Search
  CPC ............................. G03F 7/0002; G03F 7/709
  See application file for complete search history.

(56) References Cited

U.S. PATENT DOCUMENTS

| | | | | |
|---|---|---|---|---|
| 6,021,991 A | * | 2/2000 | Mayama | F16F 15/02 188/267 |
| 6,420,716 B1 | * | 7/2002 | Cox | G03F 7/70725 250/492.2 |
| 9,304,404 B2 | * | 4/2016 | Fischer | G03F 7/70825 |
| 2002/0140921 A1 | * | 10/2002 | Morisada | G03F 7/709 355/73 |
| 2004/0164253 A1 | * | 8/2004 | Ito | F16F 7/1011 250/491.1 |
| 2005/0018160 A1 | | 1/2005 | Dams et al. | |
| 2006/0272910 A1 | * | 12/2006 | Kraner | F16F 15/027 188/266.7 |
| 2007/0035074 A1 | * | 2/2007 | Vervoordeldonk | B60G 13/16 267/140.11 |
| 2008/0068603 A1 | * | 3/2008 | Nawata | G03B 27/53 356/244 |

(Continued)

FOREIGN PATENT DOCUMENTS

JP     4083708 B2     4/2008
JP     2012097786 A   5/2012

*Primary Examiner* — Deoram Persaud
(74) *Attorney, Agent, or Firm* — Rossi, Kimms & McDowell LLP

(57) ABSTRACT

The present invention provides a vibration reduction apparatus which reduces vibration of a first object supported on a base, the apparatus comprising a driving unit arranged between the base and the first object and configured to drive the first object, a reference system including a second object, and a control system including a detector configured to detect a relative distance between the first object and the second object, a compensator configured to control the driving unit such that the relative distance comes close to a target distance, and a high-pass filter configured to attenuate a signal in a predetermined frequency band in a path extending from the detector to the driving unit.

19 Claims, 7 Drawing Sheets

(56) References Cited

U.S. PATENT DOCUMENTS

| | | | | |
|---|---|---|---|---|
| 2008/0237947 A1* | 10/2008 | Warmerdam | ...... | B60G 17/0157 |
| | | | | 267/75 |
| 2008/0246200 A1* | 10/2008 | Varvoordeldonk | ..... | F16F 15/02 |
| | | | | 267/140.14 |
| 2009/0153832 A1* | 6/2009 | Tatsuzaki | ................ | G03F 7/709 |
| | | | | 355/72 |
| 2010/0089712 A1* | 4/2010 | Butler | ................... | F16F 7/1011 |
| | | | | 188/378 |
| 2010/0149516 A1* | 6/2010 | Loopstra | ............. | G03F 7/70525 |
| | | | | 355/74 |
| 2012/0045723 A1* | 2/2012 | Nawata | ................ | F16F 15/002 |
| | | | | 430/325 |
| 2012/0105820 A1 | 5/2012 | Nawata et al. | | |
| 2013/0037687 A1* | 2/2013 | Furumoto | ............. | F16F 15/002 |
| | | | | 248/550 |
| 2014/0028992 A1* | 1/2014 | Fujimoto | ............ | G03F 7/70725 |
| | | | | 355/72 |
| 2015/0268566 A1* | 9/2015 | Nawata | ................. | G05B 15/02 |
| | | | | 355/72 |
| 2015/0293463 A1* | 10/2015 | Sakata | ................ | G05B 19/402 |
| | | | | 355/72 |
| 2015/0369330 A1* | 12/2015 | Nawata | ................ | F16F 15/022 |
| | | | | 355/72 |

\* cited by examiner

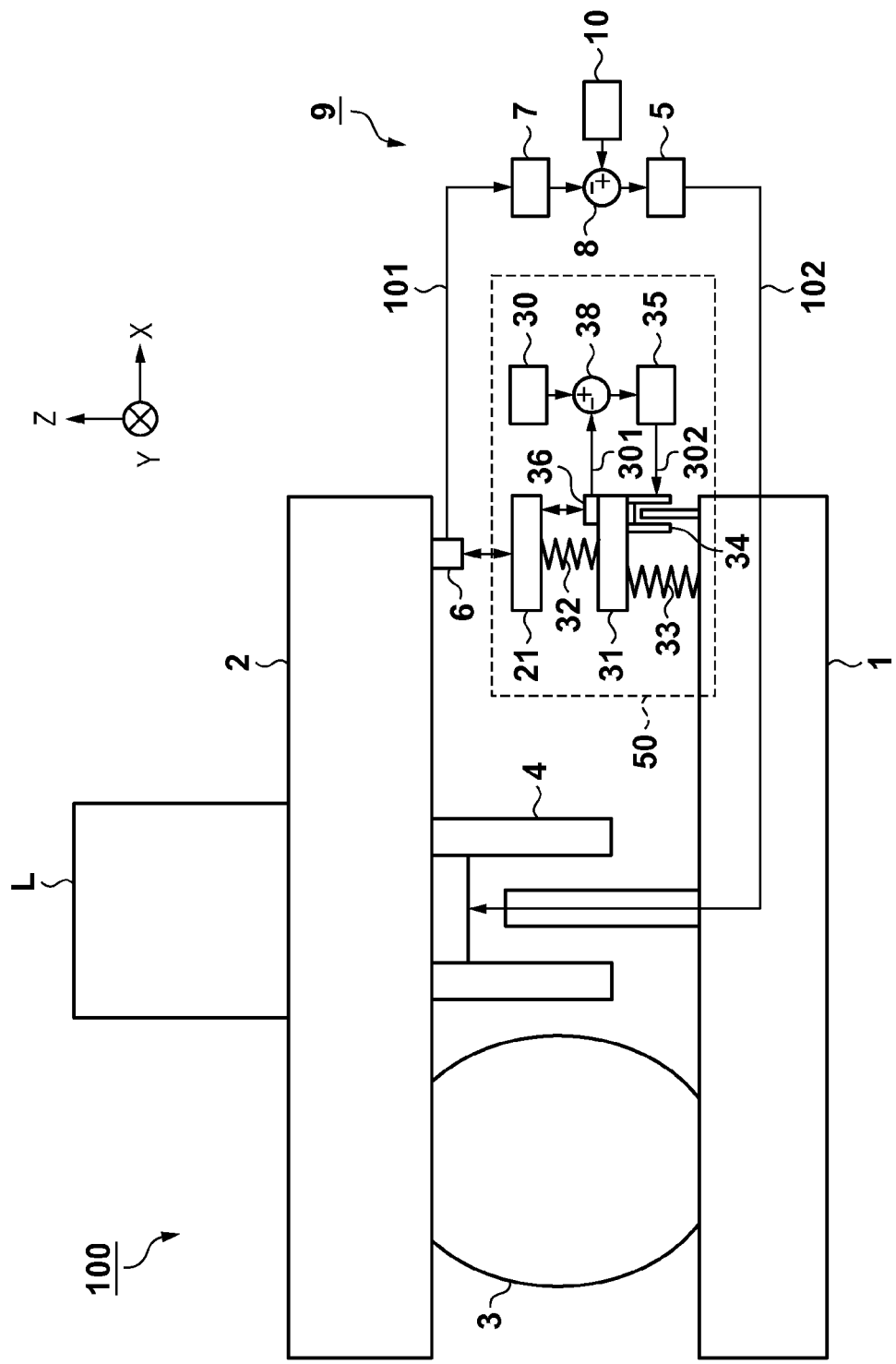

VIBRATION REDUCTION APPARATUS, LITHOGRAPHY APPARATUS AND METHOD OF MANUFACTURING ARTICLE

BACKGROUND OF THE INVENTION

Field of the Invention

The present invention relates to a vibration reduction apparatus, a lithography apparatus, and a method of manufacturing an article.

Description of the Related Art

In a lithography apparatus for forming a pattern on a substrate, the vibration transferred from the base to the main body of the lithography apparatus is a cause of deterioration in overlay accuracy and transfer accuracy. For this reason, the lithography apparatus uses a vibration reduction apparatus for reducing the vibration of a target object (first object) such as a surface plate on which the main body of the lithography apparatus is mounted.

Japanese Patent Laid-Open No. 2012-97786 and Japanese Patent No. 4083708 have proposed a vibration reduction apparatus which reduces the vibration of a target object supported on the base by using an elastic member (for example, an air spring). The vibration reduction apparatus disclosed in Japanese Patent Laid-Open No. 2012-97786 and Japanese Patent No. 4083708 includes a reference system having a reference object (second object) and an actuator which drives an object. It is possible to reduce the vibration of a target object by performing feedback control so as to make the relative distance between the reference object of the reference system and the target object approach a target distance.

In the vibration reduction apparatus disclosed in Japanese Patent Laid-Open No. 2012-97786 and Japanese Patent No. 4083708, the reference object sometimes vibrates in a predetermined frequency band due to the influence of a disturbance such as an airflow in a place where the reference system is placed. The present inventor has found that in such a situation, performing feedback control on the vibration of a target object with reference to the reference object can vibrate the target object following the vibration of the reference object.

SUMMARY OF THE INVENTION

The present invention provides a technique advantageous in reducing, for example, the vibration of an object.

According to one aspect of the present invention, there is provided a vibration reduction apparatus which reduces vibration of a first object supported on a base, the apparatus comprising: a driving unit arranged between the base and the first object and configured to drive the first object; a reference system including a second object; and a control system including a detector configured to detect a relative distance between the first object and the second object, a compensator configured to control the driving unit such that the relative distance comes close to a target distance, and a high-pass filter configured to attenuate a signal in a predetermined frequency band in a path extending from the detector to the driving unit.

Further features of the present invention will become apparent from the following description of exemplary embodiments with reference to the attached drawings.

BRIEF DESCRIPTION OF THE DRAWINGS

FIG. 9 is a view showing an example of the arrangement of the vibration reduction apparatus according to the first embodiment.

DESCRIPTION OF THE EMBODIMENTS

Figure 1:
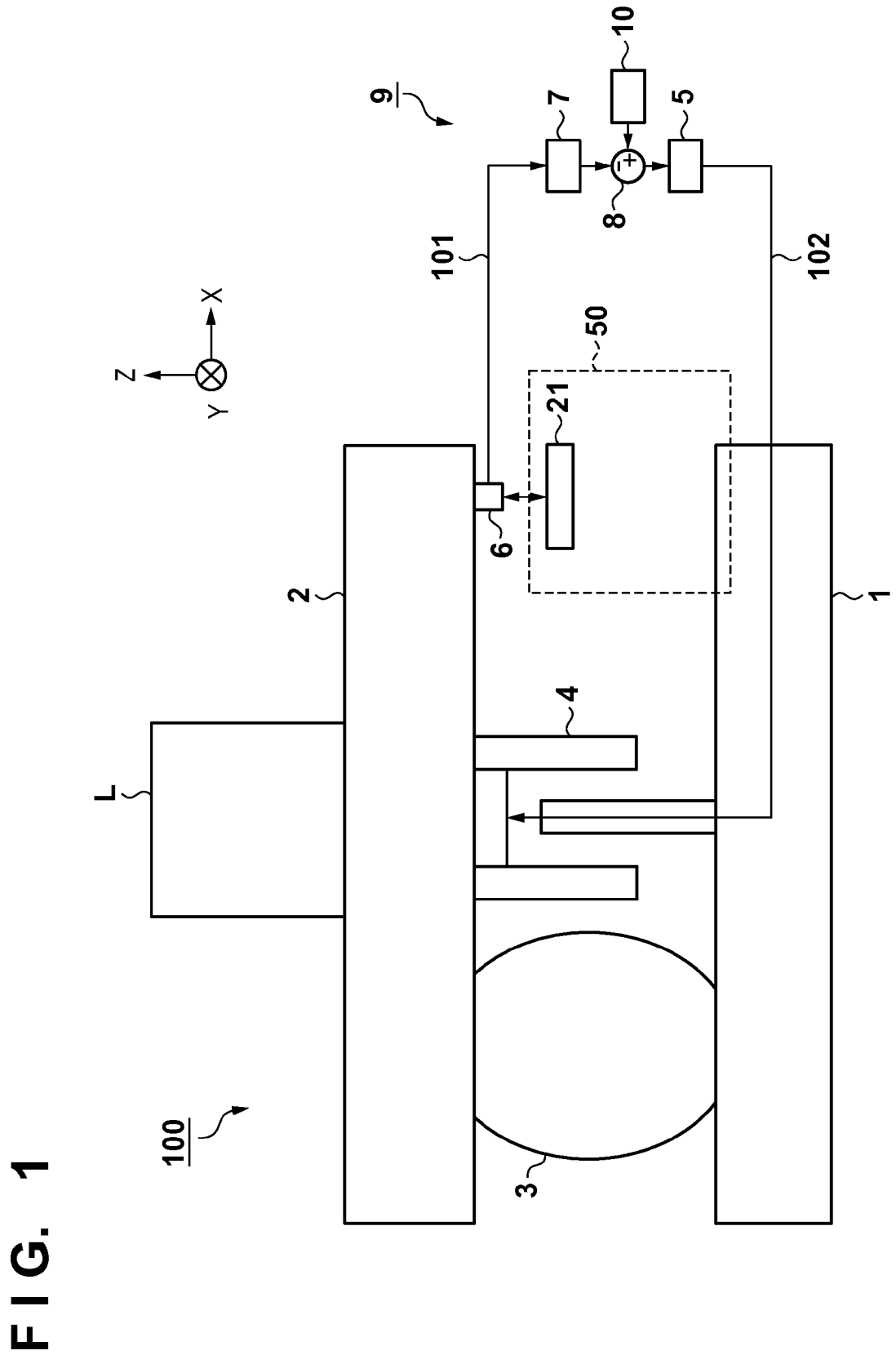
FIG. 1 is a view showing the arrangement of a vibration reduction apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

A vibration reduction apparatus 100 according to the first embodiment of the present invention will be described with reference to FIG. 1. FIG. 1 is a view showing the arrangement of the vibration reduction apparatus 100 according to the first embodiment. The vibration reduction apparatus 100 according to the first embodiment reduces the vibration of a first object 2 (target object) elastically supported on the base. The first embodiment will exemplify the vibration reduction apparatus 100 which reduces vibration of the first object 2 in the vertical direction (Z direction). In this case, the vibration reduction apparatus 100 can also reduce the vibration of the first object 2 in the horizontal direction (X and Y directions) by applying the same arrangement as that for reducing the vibration of the first object 2 in the vertical direction to vibration in the horizontal direction.

The vibration reduction apparatus 100 according to the first embodiment is applied as, for example, a constituent element of a lithography apparatus which forms a pattern on a substrate. A unit L (the main body or part of the lithography apparatus) which forms a pattern on a substrate can be mounted on the first object 2. As a lithography apparatus, there is available an imprint apparatus which molds an imprint material on a substrate, a drawing apparatus which draws on a substrate using a charged particle beam, a projection exposure apparatus which projects a mask pattern on a substrate, or the like. When using an imprint apparatus as a lithography apparatus, the unit L can include a holding unit (substrate holder or mold holder) which holds at least one of a substrate and a mold. When using a drawing apparatus as a lithography apparatus, the unit L can include an irradiation unit (barrel) which irradiates a substrate with a charged particle beam and a holding unit (substrate holder) which holds a substrate. When using a projection exposure apparatus as a lithography apparatus, the unit L can include a projection optical system (barrel) which projects a mask pattern on a substrate and a holding unit (mask holder or substrate holder) which holds at least one of a mask and a substrate.

Figure 2:
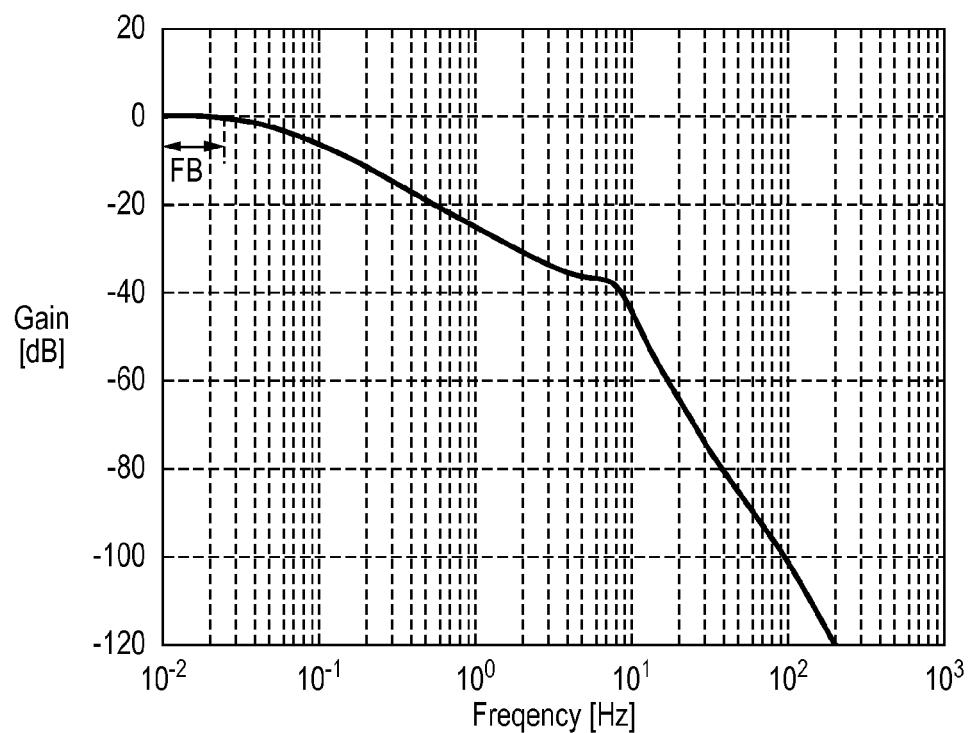
FIG. 2 is a graph showing an example of a transfer function from a base to the second object.

The vibration reduction apparatus 100 includes a base 1, the first object 2 as a target whose vibration is to be reduced, a first elastic member 3 which elastically supports the first object 2 on the base 1, a driving unit 4 which drives the first object 2 with respect to the base 1, and a reference system 50 having a second object 21 (reference object). The base 1 is fixed on a foundation portion (floor) of a place where the lithography apparatus is placed. The first elastic member 3 includes, for example, a gas spring and elastically supports the first object 2 on the base. The driving unit 4 is arranged between the base 1 and the first object 2, and drives the first object 2 in the vertical direction (Z direction) by applying a force to the first object 2. As the driving unit 4, for example, an actuator such as a linear motor can be used. In addition, the reference system 50 includes the second object 21 as a reference for the position of the first object 2 when controlling the vibration of the first object 2. For example, the second object 21 is supported on the base such that a frequency band FB in which the gain of a transfer function (FIG. 2) from the base 1 to the second object 21 is higher than −1 dB is lower than a frequency band in which the gain of a transfer function from the base 1 to the first object 2 is higher than −1 dB. A method of supporting the second object 21 on the base will be described later.

The vibration reduction apparatus 100 also includes a control system 9 which performs feedback control on the driving unit 4 so as to reduce the vibration of the first object 2. The control system 9 can include, for example, a detector 6, a subtractor 8, and a compensator 5. The detector 6 detects the relative distance (first relative distance) between the first object 2 and the second object 21 and outputs a signal 101 corresponding to the detected first relative distance. The detector 6 includes, for example, a laser interferometer, and is provided on the first object 2, as shown in FIG. 1. The detector 6 obtains the first relative distance by measuring the distance to the second object 21. Referring to FIG. 1, the detector 6 is provided on the first object 2. However, the detector 6 may be provided on the second object 21 and obtain the first relative distance by measuring the distance to the first object. The subtractor 8 calculates the deviation between the first relative distance detected by the detector 6 and a target distance 10. The compensator 5 outputs a control signal 102 for controlling the driving unit 4 so as to reduce the deviation (toward 0) calculated by the subtractor 8. The control signal 102 output from the compensator 5 is supplied to the driving unit 4. The driving unit 4 then drives the first object 2 by a drive amount corresponding to the control signal 102. When the driving unit 4 includes a linear motor, a current corresponding to the control signal 102 is supplied to the coil of the linear motor to make the linear motor drive the first object 2. With this arrangement of the control system 9, it is possible to perform feedback control on the position of the first object 2 as a target whose vibration is to be reduced, with reference to the second object 21 of the reference system 50. This can reduce the vibration generated in the first object 2.

Figure 3:
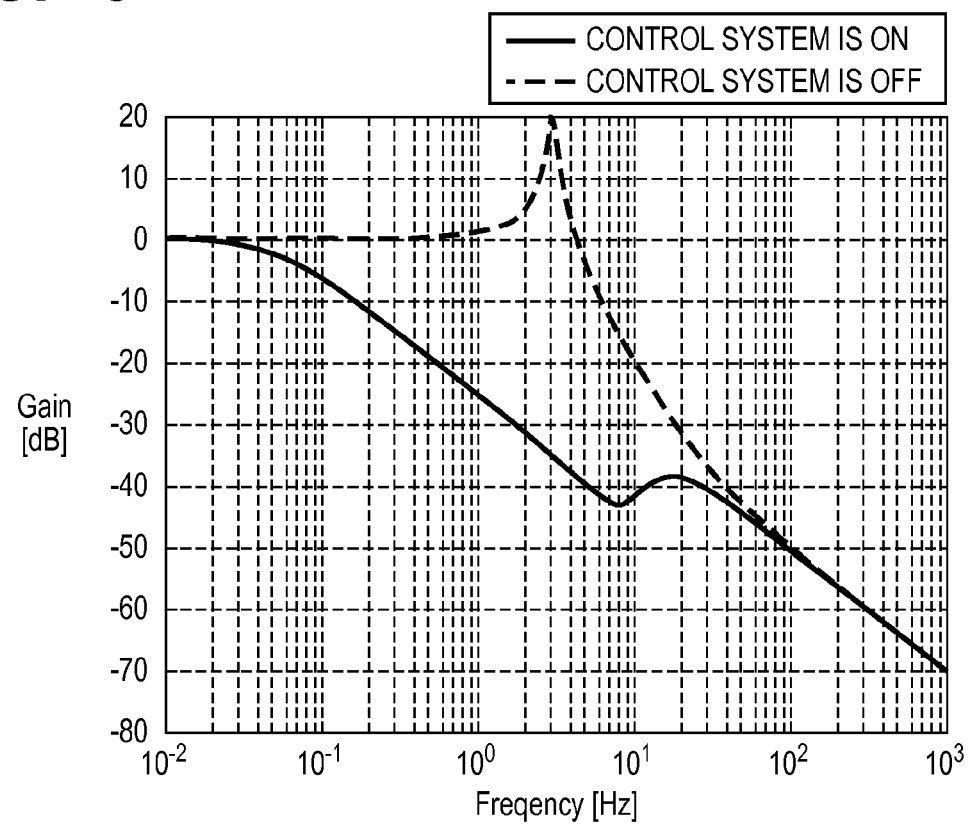
FIG. 3 is a graph showing an example of a transfer function from the base to the first object.
Figure 4:
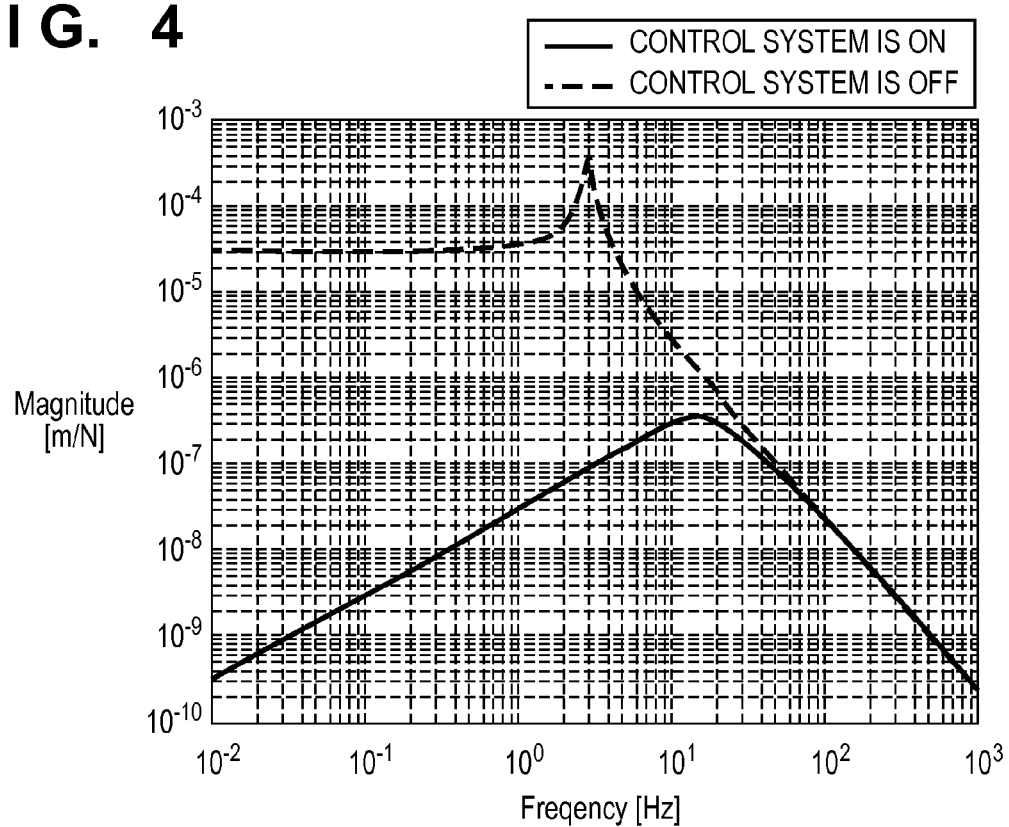
FIG. 4 is a graph showing an example of the transfer function of the compliance of the first object.

FIG. 3 is a graph showing an example of a transfer function (gain characteristics) from the base 1 to the first object 2 in the vibration reduction apparatus 100 according to the first embodiment. Referring to FIG. 3, the broken line indicates gain characteristics in a state in which the control system 9 is not activated (the control system 9 is OFF), and the solid line indicates gain characteristics in a state in which the control system 9 is activated (the control system 9 is ON). In the case shown in FIG. 3, as is obvious, the vibration reduction apparatus 100 according to the first embodiment can greatly reduce the vibration transferred from the base 1 to the first object 2 in the frequency range of about 0.1 Hz to 30 Hz by turning on the control system 9. FIG. 4 is a graph showing an example of the transfer function of the compliance of the first object 2 in the vibration reduction apparatus 100 according to the first embodiment. The compliance of the first object 2 is the value obtained by dividing the displacement of the first object 2 by the disturbance applied to the first object 2, that is, the reciprocal of stiffness. In the first embodiment, the disturbance is a force externally applied to the first object 2, and is defined as a force other than the vibration transferred from the base 1 to the first object 2. Referring to FIG. 4, the broken line indicates the transfer function of the compliance of the first object 2 when the control system 9 is OFF, and the solid line indicates the transfer function of the compliance of the first object 2 when the control system 9 is ON. In the case shown in FIG. 4, as is obvious, the vibration reduction apparatus 100 according to the first embodiment can greatly reduce the vibration of the first object 2 caused by a disturbance in the frequency range of about 30 Hz and lower by turning on the control system 9. In this manner, the vibration reduction apparatus 100 according to the first embodiment can simultaneously reduce the vibration transferred from the base 1 to the first object 2 and the vibration of the first object 2 due to the influence of a disturbance by performing feedback control on the position of the first object 2 with reference to the second object 21 of the reference system 50.

In the vibration reduction apparatus 100 according to the first embodiment, owing to the influence of a disturbance such as an airflow in the place where the reference system 50 is arranged, the second object 21 of the reference system 50 sometimes vibrates in a predetermined frequency band (to be referred to as a low-frequency band hereinafter) including the frequency band FB. In this case, since the vibration reduction apparatus 100 performs feedback control so as to make the first relative distance between the first object 2 and the second object 21 approach the target distance 10, the first object 2 can vibrate following the vibration of the second object 21 of the reference system 50. For this reason, in the vibration reduction apparatus 100 according to the first embodiment, the control system 9 is provided with a high-pass filter 7 which attenuates a signal in the low-frequency band in the path from the detector 6 to the driving unit 4. That is, in the vibration reduction apparatus 100 according to the first embodiment, the control system 9 is provided with the high-pass filter 7 in which a break frequency is set to attenuate the signal in the low-frequency band in the path from the detector 6 to the driving unit 4. Providing the high-pass filter 7 in this manner can reduce the vibration of the first object 2 following the vibration of the second object 21, even if the second object 21 vibrates at a frequency lower than the break frequency of the high-pass filter 7 due to the influence of a disturbance. In this case, in the vibration reduction apparatus 100 shown in FIG. 1, the high-pass filter 7 is arranged to attenuate the signal which fall within the low-frequency band, in the signal supplied from the detector 6 to the subtractor 8. However, the present invention is not limited to this. For example, the high-pass filter 7 may be arranged to attenuate the signal which fall within the low-frequency band, in the signal supplied from the subtractor 8 to the compensator 5.

Figure 5:
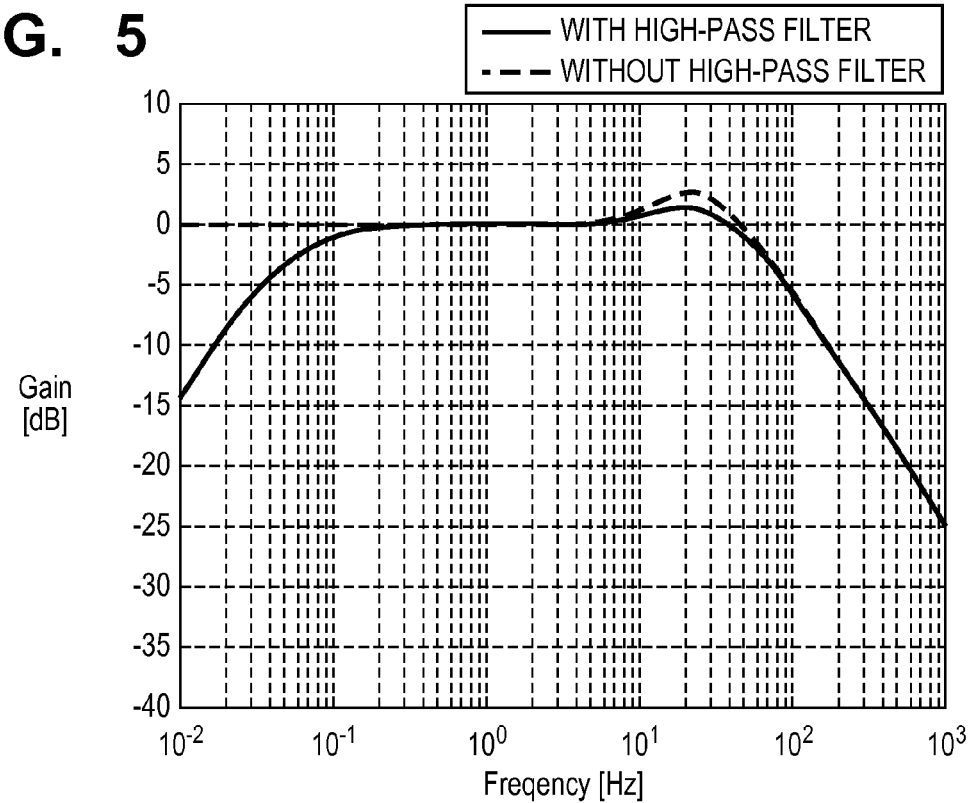
FIG. 5 is a graph showing the closed-loop transfer function of a control system in the vibration reduction apparatus according to the first embodiment.

FIG. 5 is a graph showing the closed-loop transfer function of the control system 9 in the vibration reduction apparatus 100 according to the first embodiment. Referring to FIG. 5, the broken line indicates the closed-loop transfer function of the control system 9 in a case in which the high-pass filter 7 is not provided in the control system 9, and the solid line indicates the closed-loop transfer function of the control system 9 in a case in which the high-pass filter 7 is provided in the control system 9. As is obvious from FIG. 5, providing the high-pass filter 7 in the control system 9 will reduce the gain of the closed-loop transfer function at frequencies (about 0.2 Hz or lower in FIG. 5) lower than a crossover frequency on the low-frequency side of the open-loop transfer function of the control system 9 including the high-pass filter 7. That is, this indicates that it is possible to reduce the vibration of the first object 2 following the vibration of the second object 21 at frequencies lower than the crossover frequency on the low-frequency side of the open-loop transfer function of the control system 9 including the high-pass filter 7.

Figure 6:
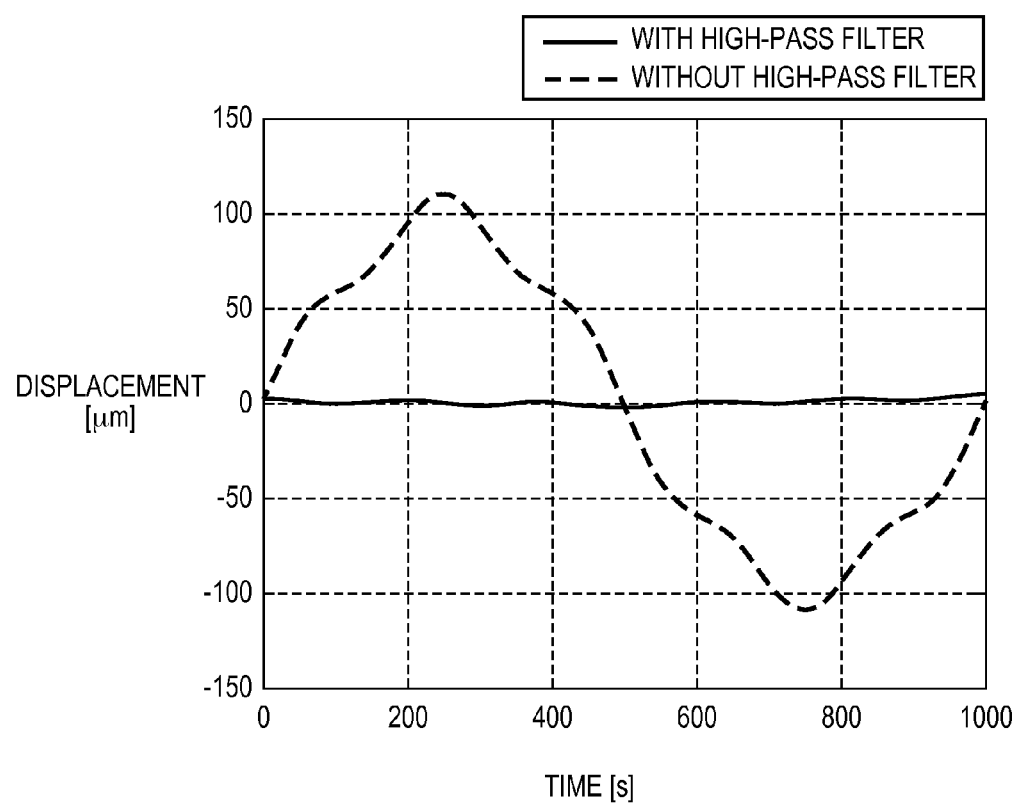
FIG. 6 is a graph showing the displacements of the first object when the second object is vibrated at frequencies lower than the break frequency of a high-pass filter.

FIG. 6 is a graph showing the displacements (Z direction) of the first object 2 when the second object 21 of the reference system 50 is vibrated at frequencies lower than the crossover frequency on the low-frequency side of the open-loop transfer function of the control system 9 including the high-pass filter 7. Referring to FIG. 6, the abscissa represents the time, the broken line represents the displacements of the first object 2 in a case in which the high-pass filter 7 is not provided in the control system 9, and the solid line represents the displacements of the first object 2 in a case in which the high-pass filter 7 is provided in the control system 9. As is obvious from FIG. 6, providing the high-pass filter 7 in the control system 9 will reduce the displacement amount of the first object 2. That is, this indicates that even if the second object 21 vibrates due to the influence of a disturbance, it is possible to reduce the vibration of the first object 2 following the vibration of the second object 21 as long as the frequency of the vibration is lower than the crossover frequency on the low-frequency side of the open-loop transfer function of the control system 9 including the high-pass filter 7.

A method of setting the break frequency of the high-pass filter 7 included in the control system 9 in the vibration reduction apparatus 100 according to the first embodiment will be described below. Since different methods are used to set the break frequency of the high-pass filter 7 depending on the arrangement of the reference system 50 and the type of the compensator 5, the methods will be described in the following examples separately depending on the arrangement of the reference system 50 and the type of the compensator 5.

[Example 1]

Figure 7:
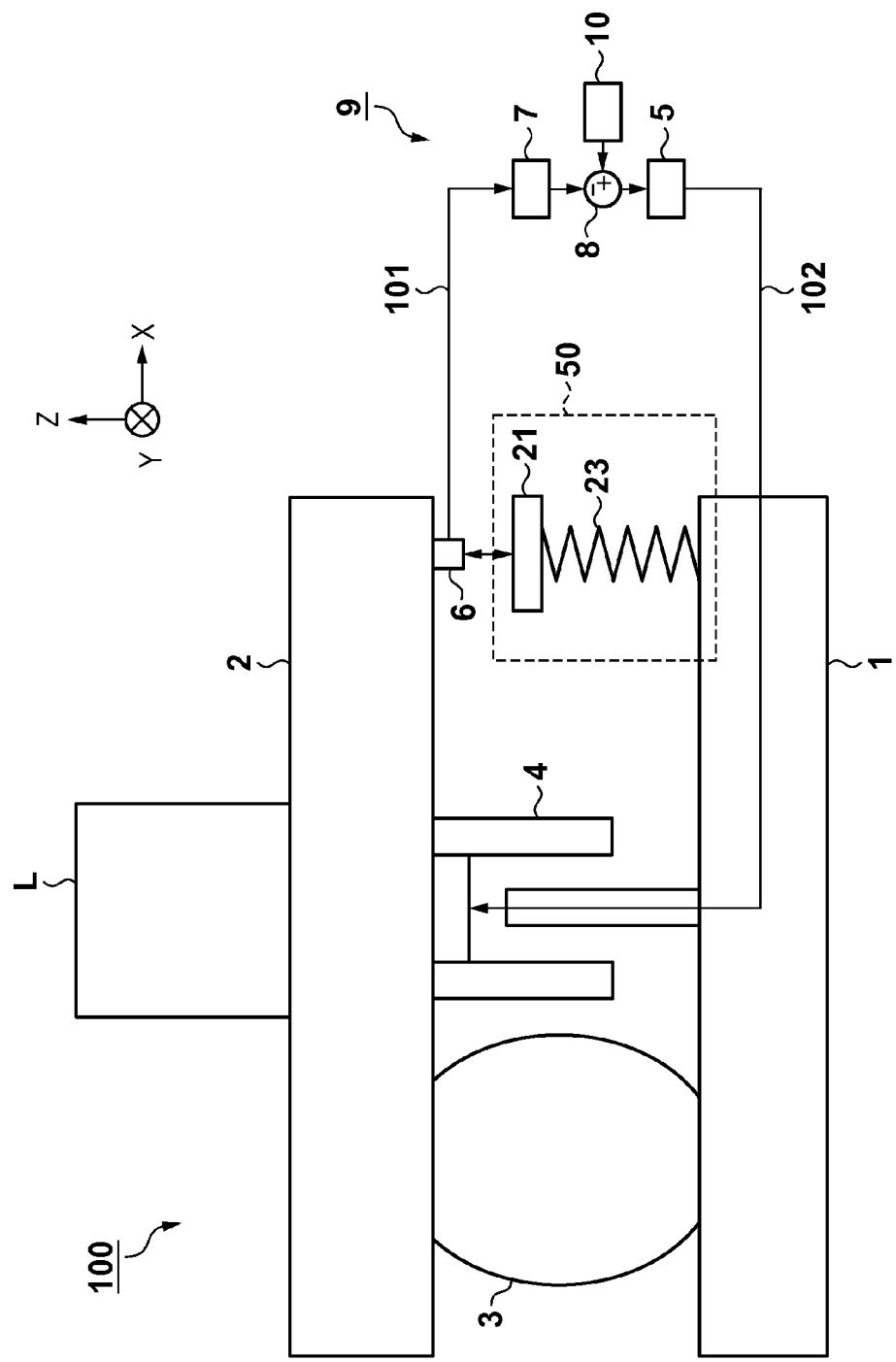
FIG. 7 is a view showing an example of the arrangement of a vibration reduction apparatus according to the first embodiment.

Example 1 will exemplify a case in which a reference system 50 includes the arrangement shown in FIG. 7. FIG. 7 is a view showing an example of the arrangement of a vibration reduction apparatus 100 according to the first embodiment. As shown in FIG. 7, the reference system 50 in Example 1 can include a second object 21 and a second elastic member 23 which elastically supports the second object 21 on the base. As the second elastic member 23, for example, an air spring or coil spring can be used.

In the reference system 50 having this arrangement, a frequency band FB in which the gain of a transfer function from a base 1 to the second object 21 is higher than −1 dB can be lower than the natural frequency of the reference system 50 which is determined by a mass $m_2$ of the second object 21 and a stiffness $k_2$ of the second elastic member 23. For this reason, in the frequency band FB, the vibration of the base 1 is almost directly transferred to the second object 21, and hence the second object 21 vibrates in accordance with the vibration of the base 1. That is, in the frequency band FB, there is little necessity to perform feedback control on the vibration of the first object 2 with reference to the second object 21. In addition, in the reference system 50 having this arrangement, the second object 21 sometimes vibrates in a low-frequency band including the frequency band FB due to the influence of a disturbance such as an airflow in a place where the reference system 50 is arranged. In this case, performing feedback control on the vibration of the first object 2 with reference to the second object 21 will vibrate the first object 2 following the vibration of the second object 21. Therefore, in order to reduce the vibration of the first object 2 following the vibration of the second object 21 in the low-frequency band including the frequency band FB, the signal which fall within the low-frequency band may be attenuated in the signal 101 from the detector 6.

A control system 9 of the vibration reduction apparatus 100 shown in FIG. 7 is provided with a high-pass filter 7 configured to have a break frequency higher than the low-frequency band including the frequency band FB. This can reduce the vibration of the first object 2 following the vibration of the second object 21 in the low-frequency band by attenuating the signal which fall within the low-frequency band, in the signal 101 from a detector 6. A method of setting the break frequency of the high-pass filter 7 in the vibration reduction apparatus 100 shown in FIG. 7 will be described separately when a compensator 5 in the control system 9 is a PID compensator and when the compensator 5 is a PD compensator.

The case in which the compensator 5 is a PID compensator will be described first. In this case, letting $kp_{11}$ be a proportional gain, $ki_{11}$ be an integral gain, and $kd_{11}$ be a derivative gain, a transfer function $Gc_{11}$ of the compensator 5 (PID compensator) is represented by equation (1). When the compensator 5 is a PID compensator, a second-order high-pass filter $HPF_1$ represented by, for example, equation (2) may be used as the high-pass filter 7. A break frequency $\omega_{n11}$ of the high-pass filter 7 is represented by equation (3). In equation (3), $k_1$ is the stiffness of the first elastic member 3, $ki_{11}$ is the integral gain of the compensator 5 (PID compensator), $m_2$ is the mass of the second object 21, and $k_2$ is the stiffness of the second elastic member 23. The break frequency $\omega_{n11}$ obtained by equation (3) may be adjusted based on the evaluations of the anti-vibration performance, damping performance, positional stability, and the like of the first object 2 at the time of the operation of the vibration reduction apparatus 100. The value of $\xi_{11}$ in equation (2) can be set between 0 to 1. In general, this value may be about 0.5.

$$Gc_{11} = kp_{11} + \frac{ki_{11}}{s} + kd_{11} \cdot s \quad (1)$$

$$HPF_1 = \frac{s^2}{s^2 + 2 \cdot \zeta_{11} \cdot \omega_{n11} \cdot s + \omega_{n11}^2} \quad (2)$$

$$\omega_{n11} = \sqrt{\frac{ki_{11}}{k_1}} \cdot \sqrt{\frac{k_2}{m_2}} \quad (3)$$

A case in which the compensator 5 is a PD compensator will be described next. In this case, letting $kp_{12}$ be a proportional gain and $kd_{12}$ be a derivative gain, a transfer function $Gc_{12}$ of the compensator 5 (PD compensator) is represented by equation (4). When the compensator 5 is a PD compensator, a first-order high-pass filter $HPF_2$ represented by, for example, equation (5) may be used as the high-pass filter 7. A break frequency $\omega_{n12}$ of the high-pass filter 7 is represented by equation (6). In equation (6), $k_1$ is the stiffness of the first elastic member 3, $kp_{12}$ is the proportional gain of the compensator 5 (PD compensator), $m_2$ is the mass of the second object 21, and $k_2$ is the stiffness of the second elastic member 23. The break frequency $\omega_{n12}$ obtained by equation (6) may be adjusted based on the evaluations of the anti-vibration performance, damping performance, positional stability, and the like of the first object 2 at the time of the operation of the vibration reduction apparatus 100.

$$Gc_{12} = kp_{12} + kd_{12} \cdot s \tag{4}$$

$$HPF_2 = \frac{s}{s + \omega_{n12}} \tag{5}$$

$$\omega_{n12} = \frac{kp_{12}}{k_1} \cdot \sqrt{\frac{k_2}{m_2}} \tag{6}$$

In addition, in the vibration reduction apparatus 100 shown in FIG. 7, the control system 9 may be provided with a low-pass filter which attenuates the signal which have frequencies higher than the servo band of the compensator 5, in the control signal 102 output from the compensator 5 (PID compensator or PD compensator) for the driving unit 4. As the low-pass filter, there is used a first-order low-pass filter $LPF_1$ represented by equation (7) or a second-order low-pass filter $LPF_2$ represented by equation (8). The break frequency $\omega_{n2}$ of the low-pass filter represented by equation (7) or (8) is represented by equation (9). In equation (9), $kd_1$ is the derivative gain of the compensator 5 (the derivative gain $kd_{11}$ of the PID compensator or the derivative gain $kd_{12}$ of the PD compensator), $m_1$ is the mass of the first object 2. In equation (8), $\xi_2$ can be set between 0 to 1. In general, this value may be about 0.5.

$$LPF_1 = \frac{\omega_{n2}}{s + \omega_{n2}} \tag{7}$$

$$LPF_2 = \frac{\omega_{n2}^2}{s^2 + 2 \cdot \zeta_2 \cdot \omega_{n2} \cdot s + \omega_{n2}^2} \tag{8}$$

$$\omega_{n2} = \frac{kd_1}{m_1} \tag{9}$$

[Example 2]

Figure 8:
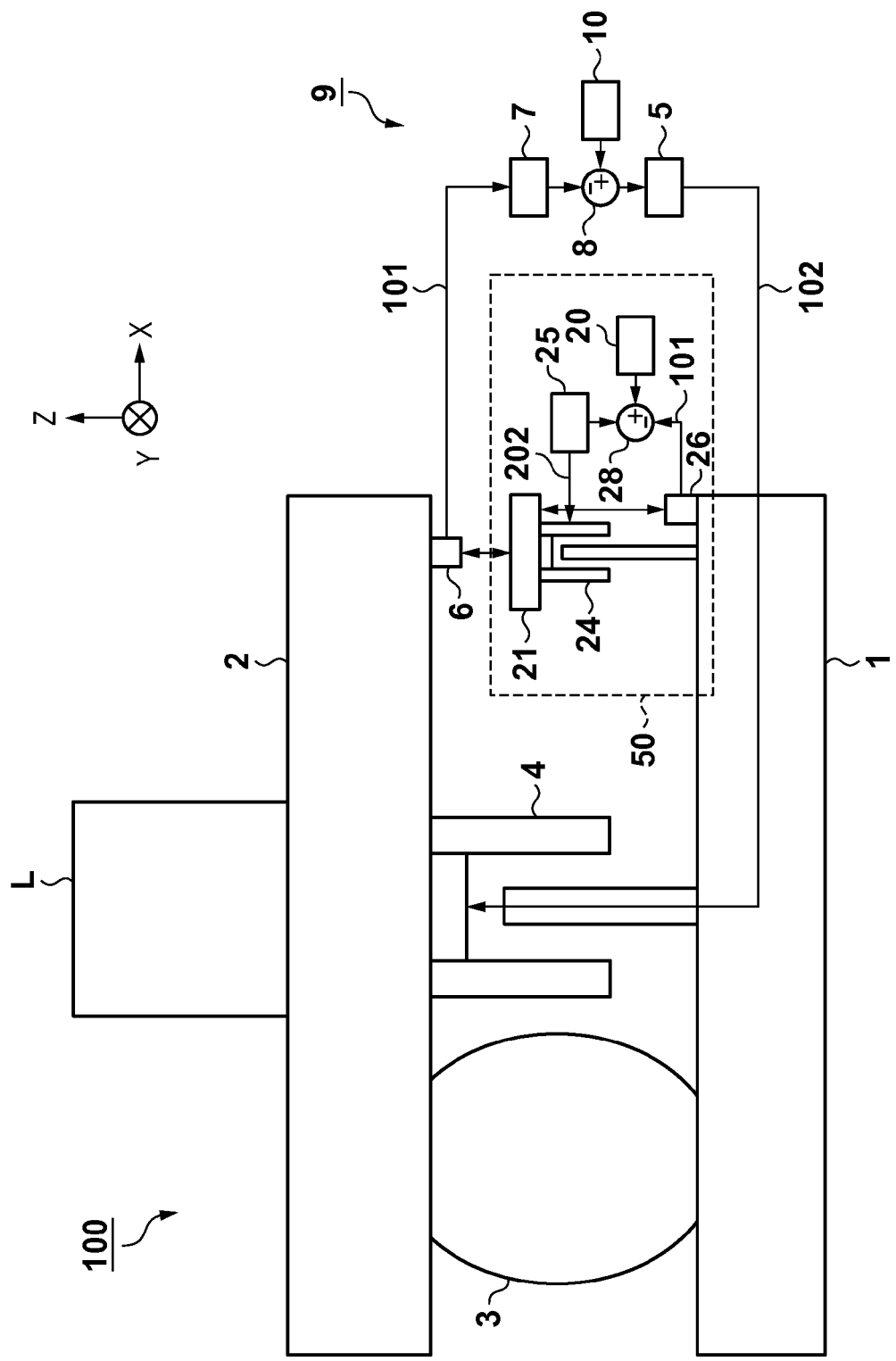
FIG. 8 is a view showing an example of the arrangement of the vibration reduction apparatus according to the first embodiment.

Example 2 will exemplify a case in which a reference system 50 includes the arrangement shown in FIG. 8. FIG. 8 is a view showing an example of the arrangement of a vibration reduction apparatus 100 according to the first embodiment. As shown in FIG. 8, the reference system 50 in Example 2 can include a second object 21, a second driving unit 24, a second detector 26, a second subtractor 28, and a second compensator 25. The second driving unit 24 is arranged between a base 1 and the second object 21, and drives the second object 21. The second driving unit 24 includes, for example, an actuator (for example, a linear motor) which drives the second object 21 in the vertical direction (Z direction) by applying a force to the second object 21. The second detector 26 detects the relative distance (second relative distance) between the base 1 and the second object 21, and outputs a signal 201 corresponding to the second relative distance. The second detector 26 includes, for example, a laser interferometer, and is provided on the base 1, as shown in FIG. 8. The second detector 26 obtains the second relative distance by measuring the distance to the second object 21. Referring to FIG. 8, the second detector 26 is provided on the base 1. However, the second detector 26 may be provided on the second object 21 to obtain the second relative distance by measuring the distance to the base 1.

The second subtractor 28 calculates the deviation between the second relative distance detected by the second detector 26 and a second target distance 20. In addition, the second compensator 25 is, for example, a PID compensator, and outputs a control signal 202 for controlling the second driving unit 24 so as to reduce (toward 0) the deviation calculated by the second subtractor 28. Letting $kp_2$ be a proportional gain, $ki_t$ be an integral gain, and $kd_2$ be a derivative gain, a transfer function $Gc_2$ of the second compensator 25 (PID compensator) is represented by equation (10). In this case, Example 2 will exemplify a case in which the second compensator 25 is a PID compensator. However, the present invention is not limited to this. The second compensator 25 may be another type of compensator such as a PD compensator.

$$Gc_2 = kp_2 + \frac{ki_2}{s} + kd_2 \cdot s \tag{10}$$

In the reference system 50 having this arrangement, a frequency band FB in which the gain of a transfer function from the base 1 to the second object 21 is higher than −1 dB can be lower than the servo band of the second compensator 25. For this reason, in the frequency band FB, the vibration of the base 1 is almost directly transferred to the second object 21, and hence the second object 21 vibrates in accordance with the vibration of the base 1. That is, in the frequency band FB, there is little necessity to perform feedback control on the vibration of the first object 2 with reference to the second object 21. In addition, in the reference system 50 having this arrangement, the second object 21 sometimes vibrates in a low-frequency band including the frequency band FB due to the influence of a disturbance such as an airflow in a place where the reference system 50 is arranged or electric noise in the second compensator 25. In this case, performing feedback control on the vibration of the first object 2 with reference to the second object 21 will vibrate the first object 2 following the vibration of the second object 21. Therefore, in order to reduce the vibration of the first object 2 following the vibration of the second object 21 in the low-frequency band including the frequency band FB, the signal which fall within the low-frequency band may be attenuated in the signal 101 from the detector 6.

A control system 9 of the vibration reduction apparatus 100 shown in FIG. 8 is provided with a high-pass filter 7 configured to have a break frequency higher than the low-frequency band including the frequency band FB. This can reduce the vibration of the first object 2 following the vibration of the second object 21 in the low-frequency band by attenuating the signal which fall within the low-frequency band, in the signal 101 from the detector 6. A method of setting the break frequency of the high-pass filter 7 in the vibration reduction apparatus 100 shown in FIG. 8 will be described separately when a compensator 5 in the control system 9 is a PID compensator and when the compensator 5 is a PD compensator. In this case, a transfer function $Gc_{11}$ of the PID compensator and a transfer function $Gc_{12}$ of the PD compensator are respectively represented by equations (1) and (4) as in the vibration reduction apparatus 100 shown in FIG. 7.

The case in which the compensator 5 is a PID compensator will be described first. When the compensator 5 is a PID compensator, a second-order high-pass filter $HPF_3$ represented by, for example, equation (11) may be used as the high-pass filter 7. A break frequency $\omega_{n13}$ of the high-pass filter 7 is represented by equation (12). In equation (12), $k_1$ is the stiffness of a first elastic member 3, $ki_{11}$ is the integral gain of the compensator 5 (PID compensator), $m_2$ is the mass of the second object 21, and $kd_2$ is the derivative gain of the second compensator 25. The break frequency $\omega_{n13}$ obtained by equation (12) may be adjusted based on the evaluations of the anti-vibration performance, damping performance, positional stability, and the like of the first object 2 at the time of the operation of the vibration reduction apparatus 100. The value of $\xi_3$ in equation (11) can be set between 0 to 1. In general, this value may be about 0.5.

$$HPF_3 = \frac{s^2}{s^2 + 2 \cdot \zeta_{13} \cdot \omega_{n13} \cdot s + \omega_{n13}^2} \quad (11)$$

$$\omega_{n13} = \sqrt{\frac{ki_{11}}{k_1} \cdot \frac{kd_2}{m_2}} \quad (12)$$

A case in which the compensator 5 is a PD compensator will be described next. When the compensator 5 is a PD compensator, a first-order high-pass filter $HPF_4$ represented by, for example, equation (13) may be used as the high-pass filter 7. A break frequency $\omega_{n14}$ of the high-pass filter 7 is represented by equation (14). In equation (14), $k_1$ is the stiffness of the first elastic member 3, $kp_{12}$ is the proportional gain of the compensator 5 (PD compensator), $m_2$ is the mass of the second object 21, and $kd_2$ is the derivative gain of the second compensator 25. The break frequency $\omega_{n14}$ obtained by equation (14) may be adjusted based on the evaluations of the anti-vibration performance, damping performance, positional stability, and the like of the first object 2 at the time of the operation of the vibration reduction apparatus 100.

$$HPF_4 = \frac{s}{s + \omega_{n14}} \quad (13)$$

$$\omega_{n14} = \frac{kp_{12}}{k_1} \cdot \frac{kd_2}{m_2} \quad (14)$$

In addition, in the vibration reduction apparatus 100 shown in FIG. 8, a control system 9 may be provided with a low-pass filter which attenuates the signal which have frequencies higher than the servo band of the compensator 5, in the control signal 102 output from the compensator 5 (PID compensator or PD compensator) for the driving unit 4. As the low-pass filter, there is used a first-order low-pass filter $LPF_1$ represented by equation (7) or a second-order low-pass filter $LPF_2$ represented by equation (8) as in the vibration reduction apparatus 100 shown in FIG. 7. The break frequency $\omega_{n2}$ of the low-pass filter represented by equation (7) or (8) can be represented by equation (9).

[Example 3]

Example 3 will exemplify a case in which a reference system 50 includes the arrangement shown in FIG. 9. FIG. 9 is a view showing an example of the arrangement of a vibration reduction apparatus 100 according to the first embodiment. As shown in FIG. 9, the reference system 50 in Example 3 can include a second object 21, a third object 31, a third elastic member 32, a fourth elastic member 33, a third driving unit 34, a third detector 36, a third subtractor 38, and a third compensator 35. The third elastic member 32 elastically supports the second object 21 on the third object 31. As the third elastic member 32, for example, a gas spring or coil spring can be used. The fourth elastic member 33 elastically supports the third object 31 on a base 1. As the fourth elastic member 33, for example, a gas spring or coil spring can be used. The third driving unit 34 is arranged between the base 1 and the third object 31, and drives the third object 31. The third driving unit 34 includes, for example, an actuator (for example, a linear motor) which drives the third object 31 in the vertical direction (Z direction) by applying a force to the third object 31. The third detector 36 detects the relative distance (third relative distance) between the second object 21 and the third object 31, and outputs a signal 301 corresponding to the third relative distance. The third detector 36 includes, for example, a laser interferometer, and is provided on the third object 31, as shown in FIG. 9. The third detector 36 obtains the third relative distance by measuring the distance to the second object 21. Referring to FIG. 9, the third detector 36 is provided on the third object 31. However, the third detector 36 may be provided on the second object 21 to obtain the third relative distance by measuring the distance to the third object 31.

The third subtractor 38 calculates the deviation between the third relative distance detected by the third detector 36 and a third target distance 30. In addition, the third compensator 35 is, for example, a PID compensator, and outputs a control signal 302 for controlling the third driving unit 34 so as to reduce (toward 0) the deviation calculated by the third subtractor 38. Letting $kp_3$ be a proportional gain, $ki_3$ be an integral gain, and $kd_3$ be a derivative gain, a transfer function $Gc_3$ of the third compensator 35 (PID compensator) is represented by equation (15).

$$Gc_3 = kp_3 + \frac{ki_3}{s} + kd_3 \cdot s \quad (15)$$

In the reference system 50 having this arrangement, a frequency band FB in which the gain of a transfer function from the base 1 to the second object 21 is higher than −1 dB can be lower than the servo band of the third compensator 35. For this reason, in the frequency band FB, the vibration of the base 1 is almost directly transferred to the second object 21, and hence the second object 21 vibrates in accordance with the vibration of the base 1. That is, in the frequency band FB, there is little necessity to perform feedback control on the vibration of a first object 2 with reference to the second object 21. In addition, in the reference system 50 having this arrangement, the second object 21 sometimes vibrates in a low-frequency band including the frequency band FB due to the influence of a disturbance such as an airflow in a place where the reference system 50 is arranged or electric noise in the third compensator 35. In this case, performing feedback control on the vibration of the first object 2 with reference to the second object 21 will vibrate the first object 2 following the vibration of the second object 21. Therefore, in order to reduce the vibration of the first object 2 following the vibration of the second object 21 in the low-frequency band including the frequency band FB, the signal which fall within the low-frequency band may be attenuated in the signal 101 from a detector 6.

A control system 9 of the vibration reduction apparatus 100 shown in FIG. 9 is provided with a high-pass filter 7 configured to have a break frequency higher than the low-frequency band including the frequency band FB. This can reduce the vibration of the first object 2 following the vibration of the second object 21 in the low-frequency band by attenuating the signal which fall within the low-frequency band, in the signal 101 from the detector 6. A method of setting the break frequency of the high-pass filter 7 in the vibration reduction apparatus 100 shown in FIG. 9 will be described separately when a compensator 5 in the control system 9 is a PID compensator and when the compensator 5 is a PD compensator. In this case, a transfer function $Gc_{11}$ of the PID compensator and a transfer function $Gc_{12}$ of the PD compensator are respectively represented by equations (1) and (4) as in the vibration reduction apparatus 100 shown in FIGS. 7 and 8.

The case in which the compensator 5 is a PID compensator will be described first. When the compensator 5 is a PID compensator, a second-order high-pass filter $HPF_5$ represented by, for example, equation (16) may be used as the high-pass filter 7. A break frequency $\omega_{n15}$ of the high-pass filter 7 is represented by equation (17). In equation (17), $k_1$ is the stiffness of a first elastic member 3, $ki_{11}$ is the integral gain of the compensator 5 (PID compensator), $m_2$ is the mass of the second object 21, $k_3$ is the stiffness of the third elastic member 32, $k_4$ is the stiffness of the fourth elastic member 33, and $ki_3$ is the integral gain of the third compensator 35. In this case, the break frequency $\omega_{n15}$ obtained by equation (17) may be adjusted based on the evaluations of the anti-vibration performance, damping performance, positional stability, and the like of the first object 2 at the time of the operation of the vibration reduction apparatus 100. The value of $\xi_{15}$ in equation (16) can be set between 0 to 1. In general, this value may be about 0.5.

$$HPF_5 = \frac{s^2}{s^2 + 2 \cdot \zeta_{15} \cdot \omega_{n15} \cdot s + \omega_{n15}^2} \tag{16}$$

$$\omega_{n15} = \sqrt{\frac{ki_{11}}{ki_3} \cdot \frac{k_4}{k_1} \cdot \frac{k_3}{m_2}} \tag{17}$$

A case in which the compensator 5 is a PD compensator will be described next. When the compensator 5 is a PD compensator, a first-order high-pass filter $HPF_6$ represented by, for example, equation (18) may be used as the high-pass filter 7. A break frequency $\omega_{n16}$ of the high-pass filter 7 is represented by equation (19). In equation (19), $k_1$ is the stiffness of the first elastic member 3, $kp_{12}$ is the proportional gain of the compensator 5 (PD compensator), $m_2$ is the mass of the second object 21, $k_3$ is the stiffness of the third elastic member 32, $k_4$ is the stiffness of the fourth elastic member 33, and $ki_3$ is the integral gain of the third compensator 35. The break frequency $\omega_{n16}$ obtained by equation (19) may be adjusted based on the evaluations of the anti-vibration performance, damping performance, positional stability, and the like of the first object 2 at the time of the operation of the vibration reduction apparatus 100.

$$HPF_6 = \frac{s}{s + \omega_{n16}} \tag{18}$$

$$\omega_{n16} = \frac{kp_{12}}{ki_3} \cdot \frac{k_4}{k_1} \cdot \frac{k_3}{m_2} \tag{19}$$

In addition, in the vibration reduction apparatus 100 shown in FIG. 9, a control system 9 may be provided with a low-pass filter which attenuates the signal which have frequencies higher than the servo band of the compensator 5, in the control signal 102 output from the compensator 5 (PID compensator or PD compensator) for the driving unit 4. As the low-pass filter, there is used a first-order low-pass filter $LPF_1$ represented by equation (7) or a second-order low-pass filter $LPF_2$ represented by equation (8), as in the case with the vibration reduction apparatus 100 shown in FIGS. 7 and 8. The break frequency $\omega_{n2}$ of the low-pass filter represented by equations (7) and (8) can be represented by equation (9).

As described above, the vibration reduction apparatus 100 according to the first embodiment has the reference system 50 including the second object 21, and performs feedback control on the vibration of the first object 2 so as to make the relative distance between the first object 2 and the second object 21 approach a target distance 10. The vibration reduction apparatus 100 is provided with the high-pass filter 7 for attenuating the signal which fall within the low-frequency band, in the signal 101 indicating the relative distances between the first object 2 and the second object 21. Providing the high-pass filter 7 in this manner can reduce the vibration of the first object 2 following the vibration of the second object 21, even if the second object 21 vibrates at a frequency lower than the break frequency of the high-pass filter 7 due to the influence of a disturbance.

<Embodiment of Method of Manufacturing Article>

A method of manufacturing an article according to an embodiment of the present invention is suitable for manufacturing an article such as a microdevice, for example a semiconductor device, or an element having a microstructure. This method of manufacturing an article according to this embodiment can include a step of forming a pattern on a substrate by using the above lithography apparatus (an exposure apparatus, imprinting apparatus, drawing apparatus, or the like) and a step of processing the substrate on which the pattern has been formed in the preceding step. The manufacturing method can further include other known steps (oxidation, film formation, deposition, doping, planarization, etching, resist removal, dicing, bonding, packaging, and the like). The method of manufacturing an article according to this embodiment is superior to the conventional method in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-248342 filed on Nov. 29, 2013, which is hereby incorporated by reference herein in its entirety.

What is claimed is:

1. A vibration reduction apparatus which reduces vibration of a first object supported by a first elastic member, the apparatus comprising:
a driving unit configured to drive the first object, wherein the driving unit is arranged in parallel with the first elastic member;
a reference system including a second object; and
a control system including a detector configured to detect a relative distance between the first object and the second object, a compensator configured to output a signal to control the driving unit based on the detected distance and a target distance, and a high-pass filter arranged in a path extending from the detector to the driving unit,
wherein the high-pass filter has a break frequency determined by a stiffness of the first elastic member.

2. The apparatus according to claim 1, wherein the high-pass filter is arranged between the detector and the compensator.

3. The apparatus according to claim 1, wherein the break frequency is higher than a frequency band in which a gain of a transfer function from a base that supports the second object to the second object is larger than −1 dB.

4. The apparatus according to claim 1, wherein the second object is supported by a second elastic member.

5. The apparatus according to claim 4, wherein letting $k_1$ be the stiffness of the first elastic member, $k_2$ be a stiffness of the second elastic member, $m_2$ be a mass of the second object, $ki_{11}$ be an integral gain of the compensator, and $\omega_{n11}$ be the break frequency of the high-pass filter, the high-pass filter is configured such that the break frequency $\omega_{n11}$ satisfies $$\omega_{n11} = \sqrt{\frac{ki_{11}}{k_1} \cdot \sqrt{\frac{k_2}{m_2}}}.$$

6. The apparatus according to claim 4, wherein letting $k_1$ be the stiffness of the first elastic member, $k_2$ be a stiffness of the second elastic member, $m_2$ be a mass of the second object, $kp_{12}$ be a proportional gain of the compensator, and $\omega_{12}$ be the break frequency of the high-pass filter, the high-pass filter is configured such that the break frequency $\omega_{n12}$ satisfies $$\omega_{n12} = \frac{kp_{12}}{k_1} \cdot \sqrt{\frac{k_2}{m_2}}.$$

7. The apparatus according to claim 1, wherein the reference system includes a second driving unit configured to drive the second object, and a second compensator configured to output a signal to control the second driving unit based on a second distance between the second object and a base that supports the second object, and a second target distance.

8. The apparatus according to claim 7, wherein letting $k_1$ be the stiffness of the first elastic member, $m_2$ be a mass of the second object, $ki_{11}$ be an integral gain of the compensator, $kd_2$ be a derivative gain of the second compensator, and $\omega_{n13}$ be the break frequency of the high-pass filter, the high-pass filter is configured such that the break frequency $\omega_{n13}$ satisfies $$\omega_{n13} = \sqrt{\frac{ki_{11}}{k_1} \cdot \frac{kd_2}{m_2}}.$$

9. The apparatus according to claim 7, wherein letting $k_1$ be the stiffness of the first elastic member, $m_2$ be a mass of the second object, $kp_{12}$ be a proportional gain of the compensator, $kd_2$ be a derivative gain of the second compensator, and $\omega_{n14}$ be the break frequency of the high-pass filter, the high-pass filter is configured such that the break frequency $\omega_{n14}$ satisfies $$\omega_{n14} = \frac{kp_{12}}{k_1} \cdot \frac{kd_2}{m_2}.$$

10. The apparatus according to claim 1, wherein the reference system includes a third object, a third elastic member that supports the second object on the third object, a fourth elastic member that supports the third object, a third driving unit configured to drive the third object, and a third compensator configured to output a signal to control the third driving unit based on a third distance between the second object and the third object, and a third target distance.

11. The apparatus according to claim 10, wherein letting $k_1$ be the stiffness of the first elastic member, $m_2$ be a mass of the second object, $ki_{11}$ be an integral gain of the compensator, $k_3$ be a stiffness of the third elastic member, $k_4$ be a stiffness of the fourth elastic member, $ki_3$ be an integral gain of the third compensator, and $\omega_{n15}$ be the break frequency of the high-pass filter, the high-pass filter is configured such that the break frequency $\omega_{n15}$ satisfies $$\omega_{n15} = \sqrt{\frac{ki_{11}}{ki_3} \cdot \frac{k_4}{k_1} \cdot \frac{k_3}{m_2}}.$$

12. The apparatus according to claim 10, wherein letting $k_1$ be the stiffness of the first elastic member, $m_2$ be a mass of the second object, $kp_{12}$ be a proportional gain of the compensator, $k_3$ be a stiffness of the third elastic member, $k_4$ be a stiffness of the fourth elastic member, $ki_3$ be an integral gain of the third compensator, and $\omega_{n16}$ be the break frequency of the high-pass filter, the high-pass filter is configured such that the break frequency $\omega_{n16}$ satisfies $$\omega_{n16} = \frac{kp_{12}}{ki_3} \cdot \frac{k_4}{k_1} \cdot \frac{k_3}{m_2}.$$

13. The apparatus according to claim 1, wherein the control system includes a low-pass filter configured to attenuate a signal, which has a frequency higher than a servo band of the compensator, in the signal output from the compensator for the driving unit.

14. The apparatus according to claim 13, wherein letting $kd_1$ be a derivative gain of the compensator, and $m_1$ be a mass of the first object, and $\omega_{n2}$ be a break frequency of the low-pass filter, the low-pass filter is configured such that the break frequency $\omega_{n2}$ satisfies $$\omega_{n2} = \frac{kd_1}{m_1}.$$

15. A lithography apparatus comprising:
a pattern forming unit configured to form a pattern on a substrate; and
a vibration reduction apparatus comprising:
  a driving unit configured to drive the first object supported by a first elastic member, wherein the driving unit is arranged in parallel with the first elastic member;
  a reference system including a second object; and
  a control system including a detector configured to detect a distance between the first object and the second object, a compensator configured to output a signal to control the driving unit based on the detected distance and a target distance, and a high-pass filter arranged in a path extending from the detector to the driving unit,
wherein the high-pass filter has a break frequency determined by a stiffness of the first elastic member, and
wherein the pattern forming unit is mounted on the first object of the vibration reduction apparatus.

16. The apparatus according to claim 15, wherein
the first object is supported on a base by the first elastic member, and
the second object is arranged between the first object and the base.

17. The apparatus according to claim 15, wherein the pattern forming unit includes a barrel irradiating the substrate held by the holding unit with beam or light.

18. The apparatus according to claim 15, wherein the pattern forming unit includes a substrate holding unit which holds the substrate, a mask holding unit which holds a mask, and is configured to transfer a pattern of the mask held by the mask holding unit to the substrate held by the substrate holding unit.

19. A method of manufacturing an article, the method comprising:
forming a pattern on a substrate using a lithography apparatus; and
processing the substrate, on which the pattern has been formed, to manufacture the article,
wherein the lithography apparatus includes:
  a pattern forming unit configured to form a pattern on the substrate; and
  a vibration reduction apparatus,
wherein the vibration reduction apparatus reduces vibration of a first object and includes:
  a driving unit configured to drive the first object supported by a first elastic member, wherein the driving unit is arranged in parallel with the first elastic member;
  a reference system including a second object; and
  a control system including a detector configured to detect a distance between the first object and the second object, a compensator configured to output a signal to control the driving unit based on the detected distance and a target distance, and a high-pass filter arranged in a path from the detector to the driving unit,
wherein the high-pass filter has a break frequency determined by a stiffness of the first elastic member, and
  wherein the pattern forming unit is mounted on the first object.

* * * * *